(12) United States Patent
Nakamura

(10) Patent No.: US 7,795,611 B2
(45) Date of Patent: Sep. 14, 2010

(54) FIELD EFFECT ORGANIC TRANSISTOR

(75) Inventor: Shinichi Nakamura, Isehara (JP)

(73) Assignee: Canon Kabushiki Kaisha, Tokyo (JP)

( * ) Notice: Subject to any disclaimer, the term of this patent is extended or adjusted under 35 U.S.C. 154(b) by 67 days.

(21) Appl. No.: 10/555,303

(22) PCT Filed: Jul. 2, 2004

(86) PCT No.: PCT/JP2004/009789

§ 371 (c)(1),
(2), (4) Date: Nov. 2, 2005

(87) PCT Pub. No.: WO2005/006461

PCT Pub. Date: Jan. 20, 2005

(65) Prior Publication Data
US 2007/0034860 A1    Feb. 15, 2007

(30) Foreign Application Priority Data
Jul. 14, 2003    (JP)    ............... 2003-196336

(51) Int. Cl.
*H01L 51/10* (2006.01)
(52) U.S. Cl. ................ 257/40; 257/E51.006
(58) Field of Classification Search ............... 438/99; 257/40, E51.001–E51.052
See application file for complete search history.

(56) References Cited

U.S. PATENT DOCUMENTS

| | | | |
|---|---|---|---|
| 4,721,601 A * | 1/1988 | Wrighton et al. | 422/82.03 |
| 5,008,041 A * | 4/1991 | Cameron et al. | 252/500 |
| 5,107,308 A * | 4/1992 | Koezuka et al. | 257/40 |
| 5,500,537 A * | 3/1996 | Tsumura et al. | 257/40 |
| 5,596,208 A | 1/1997 | Dodabalapur et al. | |
| 6,107,117 A | 8/2000 | Bao et al. | 438/99 |
| 6,278,127 B1 | 8/2001 | Dodabalapur et al. | |
| 6,586,791 B1 * | 7/2003 | Lee et al. | 257/295 |
| 6,692,658 B2 | 2/2004 | Nakamura et al. | 252/299.65 |
| 6,720,572 B1 * | 4/2004 | Jackson et al. | 257/40 |
| 6,737,303 B2 * | 5/2004 | Cheng et al. | 438/150 |

(Continued)

FOREIGN PATENT DOCUMENTS

EP    0 716 459    6/1996

(Continued)

OTHER PUBLICATIONS

Lodha, A., et al., "Prospects of manufacturing organic semiconductor-based integrated circuits", IEEE Transactions on Semiconductor Manufacturing, vol. 14, No. 3, Aug. 2001.*

(Continued)

*Primary Examiner*—Matthew W Such
(74) *Attorney, Agent, or Firm*—Fitzpatrick, Cella, Harper & Scinto

(57) ABSTRACT

A field effect organic transistor includes a source electrode, a drain electrode, a gate electrode, a gate insulating layer and an organic semiconductive layer; in the field effect organic transistor, the organic semiconductive layer includes a first organic semiconductive layer forming a channel region and a second organic semiconductive layer arranged to abut the first organic semiconductive layer; the charge mobility ($\mu_1$) in the first organic semiconductive layer is $10^{-3}$ cm$^2$/Vs or more; the charge mobility ($\mu_2$) in the second organic semiconductive layer is $10^{-4}$ cm$^2$/Vs or less; and the ratio ($\mu_1$/&$\mu_2$) between the two organic semiconductive layers is 10 or more.

5 Claims, 1 Drawing Sheet

U.S. PATENT DOCUMENTS

| | | | |
|---|---|---|---|
| 6,828,582 B1* | 12/2004 | Ando et al. | 257/40 |
| 6,875,996 B2 | 4/2005 | Nakamura | 257/40 |
| 6,936,186 B2 | 8/2005 | Igawa et al. | 252/299.01 |
| 7,253,848 B2* | 8/2007 | Wong et al. | 349/43 |
| 7,470,574 B2* | 12/2008 | Bao et al. | 438/157 |
| 2002/0164835 A1 | 11/2002 | Dimitrakopoulos et al. | 438/99 |
| 2003/0015698 A1* | 1/2003 | Baldo et al. | 257/40 |
| 2003/0085398 A1* | 5/2003 | Koyama et al. | 257/40 |
| 2003/0218166 A1* | 11/2003 | Tsutsui | 257/40 |
| 2004/0004215 A1* | 1/2004 | Iechi et al. | 257/40 |
| 2004/0061104 A1* | 4/2004 | Bao et al. | 257/40 |
| 2004/0108562 A1* | 6/2004 | Nagayama et al. | 257/434 |
| 2004/0150050 A1* | 8/2004 | Yan et al. | 257/368 |
| 2004/0155239 A1* | 8/2004 | Yan et al. | 257/40 |
| 2004/0161873 A1* | 8/2004 | Dimitrakopoulos et al. | 438/99 |
| 2004/0178428 A1* | 9/2004 | Chou et al. | 257/283 |
| 2004/0186265 A1* | 9/2004 | Liu et al. | 528/377 |
| 2004/0195563 A1* | 10/2004 | Bao et al. | 257/40 |
| 2005/0062066 A1* | 3/2005 | Bao et al. | 257/202 |
| 2005/0064623 A1* | 3/2005 | Bao | 438/99 |
| 2006/0234151 A1* | 10/2006 | Nakagawa et al. | 430/234 |
| 2006/0234335 A1 | 10/2006 | Nakamura | 435/68.1 |

FOREIGN PATENT DOCUMENTS

| | | | |
|---|---|---|---|
| JP | 62-42564 | | 2/1987 |
| JP | 63-14471 | A | 1/1988 |
| JP | 3-255669 | A | 11/1991 |
| JP | 7-162003 | | 6/1995 |
| JP | 8-228034 | | 9/1996 |
| JP | 8-228034 | A | 9/1996 |
| JP | 10-190001 | | 7/1998 |
| JP | 10-190001 | A | 7/1998 |
| JP | 2004-165427 | A | 6/2004 |
| JP | 2004-260121 | | 9/2004 |

OTHER PUBLICATIONS

Lodha, A., "Prospects of Manufacturing Organic Semiconductor-Based Integrated Circuits", IEEE Transactions on Semiconductor Manufacturing, vol. 14, No. 3, Aug. 2001.*

Conwell, E.M. and Basko, D.M. "Polarons and Conduction in DNA." Synthetic Metals. vol. 137 (2003): pp. 1381-1383.*

Hansma, H.G. et al. "Properties of Biomolecules Measured from Atomic Force Microscope Images: A Review." Journal of Strctural Biology. vol. 119 (1997): pp. 99-108.*

Drury, C.J. et al. "Low-Cost All-Polymer Integrated Circuits." Applied Physics Letters. vol. 73 (1998): pp. 108-110.*

Assadi, A., et al. "Field-Effect Mobility of Poly(3-hexylthiophene)." Appl. Phys. Lett., vol. 53, No. 3 (Jul. 18, 1988): pp. 195-197.*

Bao, Zhenan and Locklin, Jason. Organic Field-Effect Transistors. London: CRC Press (2007): pp. 164, 176, 204, 207.*

Van Slyke, S.A., et al. "Organic Electroluminescent Devices with Improved Stability." Appl. Phys. Lett., vol. 69, No. 15 (Oct. 7, 1996): pp. 2160-2162.*

Shu Hotta, et al., "Crystal Structures of Oligothiophenes and Their Relevance to Charge Transport", Advanced Materials, vol. 5, No. 12, 1993, pp. 896-908.

Jackson, et al., "Organic Thin-Film Transistors for Organic Light-Emitting Flat-Panel Display Backplanes", IEEE Journal of Selected Topics in Quantum Electronics, vol. 4, No. 1, 1998, pp. 100-104.

* cited by examiner

FIELD EFFECT ORGANIC TRANSISTOR

TECHNICAL FIELD

The present invention relates to a field effect organic transistor, in particular, a field effect organic transistor, including an organic semiconductive layer, useful in the electronic field including display devices, information tags, and ICs.

BACKGROUND ART

In rivalry with the silicon transistor based on the crystalline silicon technology, the development of the transistors utilizing organic semiconductors has been actively carried out. Organic semiconductors are provided with the characteristics inherent to organic materials including lightweightness, flexibility, diversity, and toughness; organic semiconductors can be formed by the low temperature processes around 100° C., and permit the fabrication method based on the liquid phase processes such as printing and spin coating. Accordingly, the fabrication on the plastic substrates and the enlargement of the image planes, both having been impossible with the crystalline silicon semiconductor, can be possible, and thus, more expectations are placed on the application of organic semiconductors to novel devices such as flexible electronic paper and information tags.

However, the usual organic semiconductors are as low as $10^{-5}$ to $10^{-2}$ cm$^2$/Vs in mobility, lower in mobility by an order of magnitude or more than the silicon semiconductors, and thus higher in resistance, so that the organic semiconductors face the problems such that large currents can be hardly obtained and the operation frequencies are low.

The mobility that can be obtained with a field effect organic transistor can be derived from the formula (I) of the drain current in the saturation region.

$$Id=\mu(W/2L)Ci(Vg-Vth)^2 \tag{I}$$

In this formula, Id denotes the drain current (A), $\mu$ denotes the mobility (cm$^2$/Vs), W denotes the channel width (cm), L denotes the channel length (cm), Ci denotes the capacity of the gate insulating layer (F/cm$^2$), Vg denotes the gate voltage (V), Vth denotes the threshold voltage (V) of the transistor, which can be obtained from the relation between the square root of the drain current and the gate voltage by extrapolation to the drain current Id=0.

Additionally, when used as a switching device, it is necessary that the ratio (on/off ratio) of the current flowing between the source and drain electrodes when the transistor is on to the current flowing between the source drain electrodes when the transistor is off be at least $10^4$ or more, preferably $10^6$ or more. However, in the case of an organic semiconductor, the mobility is low as described above, and hence the on current is small; on the other hand, owing to the effect of the impurities contained in the organic semiconductor, the off current is large; so that a sufficiently large on/off ratio has not yet been obtained. This is conspicuous for polymer compounds.

A technique for improving the on/off ratio, disclosed in Japanese Patent Application Laid-Open No. 10-190001, has made the mobility be $10^{-3}$ cm$^2$/Vs or more and the conductivity be $10^{-5}$ S/cm or less, and thus has made the on/off ratio be of the order of $10^3$; however, this is not yet sufficient. Thus, it is the actual condition that there is no field effect organic transistor which utilizes an organic semiconductor capable of satisfying the practical characteristics.

DISCLOSURE OF INVENTION

The present invention has been achieved in view of such conventional techniques, and aims at the provision of a field effect organic transistor which overcomes the above described problems, and is large in mobility and high in on/off ratio.

The field effect organic transistor provided by the present invention is a field effect organic transistor which includes a source electrode, a drain electrode, a gate electrode, a gate insulating layer and an organic semiconductive layer, the field effect organic transistor being characterized in that:

the organic semiconductive layer includes a first organic semiconductive layer forming a channel region and a second organic semiconductive layer arranged to abut the first organic semiconductive layer;

the charge mobility ($\mu_1$) in the first semiconductive layer is $10^{-3}$ cm$^2$/Vs or more;

the charge mobility ($\mu_2$) in the second semiconductive layer is $10^{-4}$ cm$^2$/Vs or less; and the ratio ($\mu_1/\mu_2$) between the two organic semiconductive layers is 10 or more.

The present invention includes a device in which the thickness of the first semiconductive layer is made to be 5 to 100 nm.

The present invention includes a device in which the thickness of the second semiconductive layer is made to be 100 to 1,000 nm.

Additionally, there is included a device in which the thickness of the channel region is made to be 50 nm or less.

The present invention includes a device in which the organic semiconductive layer is constructed with a conjugated polymer compound permitting utilizing a liquid phase process for the fabrication of the organic semiconductive layer.

The present invention includes a device in which the weight average molecular weight of the conjugated polymer compound is made to be 5,000 to 500,000.

Additionally, the present invention includes a device in which the gate insulating layer is constructed with an organic compound.

According to the present invention, a field effect organic transistor which is large in mobility and high in on/off ratio can be provided in the field of electronics including display devices, information tags and ICs.

BEST MODE FOR CARRYING OUT THE INVENTION

The structure of the field effect organic transistor of the present invention is effective in any of the planar type, staggered type and inversely staggered type; detailed description will be made on the present invention by taking the planar type as an example with reference to FIG. 1.

Figure 1:
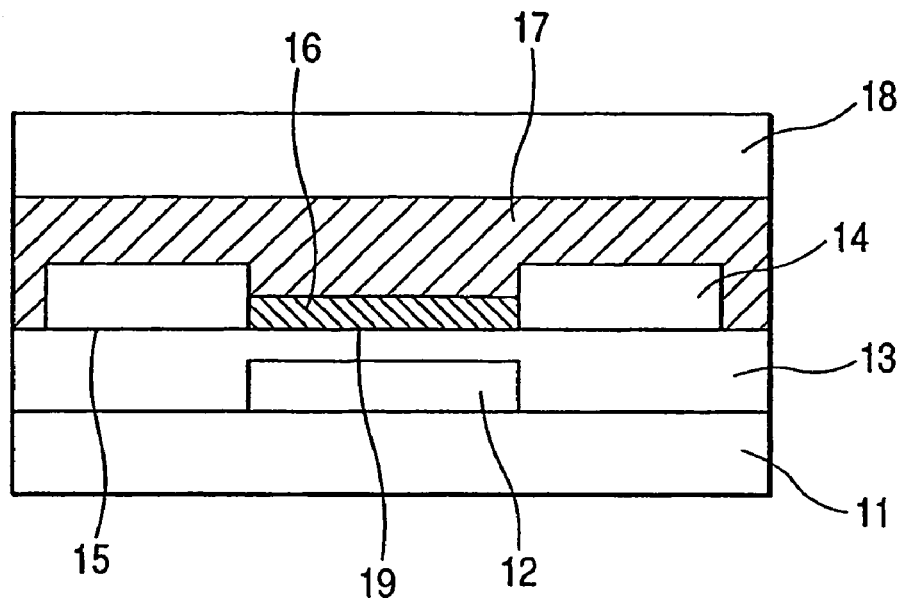
FIG. 1 is a schematic sectional view illustrating an example of a field effect organic transistor of the present invention.

FIG. 1 is a schematic sectional view illustrating an example of a field effect organic transistor of the present invention. In this figure, the field effect organic transistor of the present invention is constructed by arranging a gate electrode 12 on an insulative substrate 11, a gate insulating layer 13 thereover, additionally a source electrode 15 and a drain electrode 14 thereover, organic semiconductive layers 16, 17 thereover, and a protective film 18 as the uppermost portion.

The present invention is characterized in that the mobilities of the organic semiconductive layers 16, 17 are different from each other. In particular, preferable is a device in which the organic semiconductive layer 16 to be a channel region 19 for charge transfer is higher in mobility than the organic semiconductive layer 17 not to be a channel region. The channel region used in the present invention broadly means, depending on the channel length, the region from the interface with the gate insulating layer 13 up to the 50 nm or less thick portion of the organic semiconductive layer.

As the method for forming the regions different in mobility from each other in the organic semiconductive layer, there can be cited a method in which one type of organic semiconductive layer is used and the orientation condition thereof is varied to form regions different from each other in mobility, and a method in which two or more types of organic semiconductors different in mobility from each other are deposited to form regions different in mobility from each other. In the case of the former, as the method for varying the orientation condition, when the organic semiconductive layer is deposited by a vapor phase method as the method for varying the orientation condition, the orientation condition can be attained by varying the evaporation rate and the substrate temperature. When deposited by a liquid phase method, the orientation condition can be attained by varying the drying temperature and the type of the environmental gas.

Additionally, in order to make the effect of the present invention effective, the mobility $\mu_1$ of the organic semiconductive layer 16 to be the channel region falls in the range of $10^{-3}$ cm²/Vs or more, preferably $10^{-2}$ cm²/Vs or more.

Additionally, the mobility $\mu_2$ of the organic semiconductive layer 17 not to be the channel region falls in the range of $10^{-4}$ cm²/Vs or less, preferably $10^{-5}$ cm²/Vs or less.

Additionally, in order to make the effect of the present invention effective, the two mobilities of the organic semiconductive layers 16, 17 satisfy the relation $\mu_1 > \mu_2$, and the mobility ratio ($\mu_1/\mu_2$) is preferably 10 or more, and further preferably 100 or more.

The values of the mobilities of the organic semiconductive layers 16, 17 indicate the value obtained from the above described formula (I) obtained for the field effect organic transistor.

Additionally, it is preferable that the thickness of the organic semiconductive layer 16 is 5 to 100 nm and the thickness of the organic semiconductive layer 17 is 100 to 1000 nm.

No particular constraint is imposed on the organic semiconductive layer used in the present invention, as far as the layer is formed of a conjugated compound having conjugated double bonds. For example, the compounds listed below are preferable.

Examples of such compounds include:

conjugated polymer compounds such as polyacetylene derivatives, polythiophene derivatives having thiophene rings, poly(3-alkylthiophene) derivatives, poly(3,4-ethylenedioxythiophene) derivatives, polythienylenevinylene derivatives, polyphenylene derivatives having benzene rings, polyphenylenevinylene derivatives, polypyridine derivatives having nitrogen atoms, polypyrrole derivatives, polyaniline derivatives, and polyquinoline derivatives;

oligomers represented by dimethyl sexithiophene and quarterthiophene;

acenes represented by perylene, tetracene and pentacene;

deposited organic molecules represented by copper phthalocyanine derivatives;

discotic liquid crystals represented by triphenylene derivatives;

smectic liquid crystals represented by phenylnaphthalene derivatives and benzothiazole derivatives; and liquid crystal polymers represented by poly(9,9-dialkylfluorene-bithiophene) copolymer. However, the compounds concerned are not limited to these compounds.

Additionally, from the viewpoint that a liquid phase process can be preferably utilized, the above described polymer compounds having conjugated structure are suitable. For example, there can be cited the following compounds having the structures shown below.

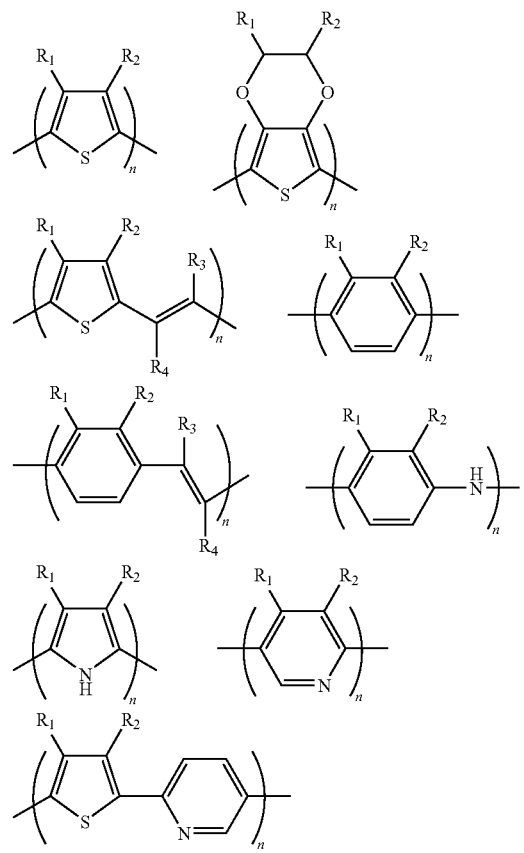

In the above formulas, $R_1$, $R_2$, $R_3$ and $R_4$ each represent H, F or an alkyl group having 1 to 20 carbon atoms or an alkoxy group having 1 to 20 carbon atoms, and n represents a positive integer.

No particular constraint is imposed on the weight average molecular weights of these conjugated polymer compounds, but in consideration of the solubility in solvents and the film formability, it is desirable that the molecular weights concerned are 5,000 to 500,000, and preferably 10,000 to 100,000.

Additionally, the organic semiconductive layer used in the present invention may contain appropriate dopants for the purpose of adjusting the electric conductivity thereof. Examples of the dopants include acceptor type dopants such as $I_2$, $Br_2$, $Cl_2$, $BF_3$, $PF_5$, $H_2SO_4$, $FeCl_3$ and TCNQ (tetracyanoquinodimethane); donor type dopants such as Li, K, Na, Eu; and surfactants such as alkylsulfonates and alkylbenzenesufonates.

No particular constraint is imposed on the gate insulating layer of the present invention; there can be used inorganic materials such as $SiO_2$, $SiN_x$, $Al_2O_3$ and $Ta_2O_5$; organic materials such as polyimide, polyacrylonitrile, polytetrafluoroethylene, polyvinyl alcohol, polyvinylphenol, polyethylene terephthalate and polyvinylidenefluoride; and organic-inorganic hybrid materials. From the viewpoint that a liquid process leading to low cost can be preferably utilized, organic compounds are preferable.

No particular constraint is imposed on the insulative substrate; there can be used, in addition to inorganic materials such as glass and quartz, photosensitive polymer compounds such as acrylic based, vinyl based, ester based, imide based, urethane based, diazo based and cinnamoyl photosensitive polymer compounds; organic materials such as polyvinylidenefluoride, polyethylene terephtahlate and polyethylene; and organic-inorganic hybrid materials. Additionally, two or more layers of these materials can be deposited to be used, and this deposition is effective for the purpose of enhancing the withstand voltage.

Additionally, no particular constraints are imposed on the gate electrode, source electrode and drain electrode as far as these electrodes are electric conductors; for example, suitable are metal materials such as Al, Cu, Ti, Au, Pt, Ag and Cr, and inorganic materials such as polysilicone, silicide, ITO (indium tin oxide) and $SnO_2$; and there can be used conducting polymers represented by highly doped polypyridine, polyacetylene, polyaniline, polypyrrole and polythiophene; conducting inks in which carbon particles, silver particles or the like are dispersed; and the like. In particular, when used in flexible electronic paper and the like, it is preferable that each of these electrodes is formed of a conducting polymer, or conducting inks in which carbon particles, silver particles or the like are dispersed because the thermal expansions of these electrodes can be easily conformed with the thermal expansion of the substrate.

No particular constraints are imposed on the methods for forming these various electrodes, the gate insulating layer and the organic semiconductive layer; for the cases of organic materials, these members can be formed with the aid of the electrolytic polymerization method, the casting method, the spin coating method, the soak-coating method, the screen printing method, the micromold method, the microcontact method, the roll coating method, the inkjet method, the LB method and the like. Additionally, depending on the materials used, the vacuum deposition method, the CVD method, the electron beam deposition method, the resistance heating deposition method, the sputtering method and the like are also effective formation methods. Additionally, these members can be subjected to the patterning into desired shapes with the aid of the photolithograph and etching treatment. Alternatively, the soft lithograph and inkjet methods are also effective methods for patterning. Additionally, according to need, extractor electrodes from the respective electrodes, protective films and the like can be formed.

EXAMPLES

More detailed description will be made below on the present invention on the basis of the examples, but the present invention is not limited by these examples.

Example 1

Figure 2:
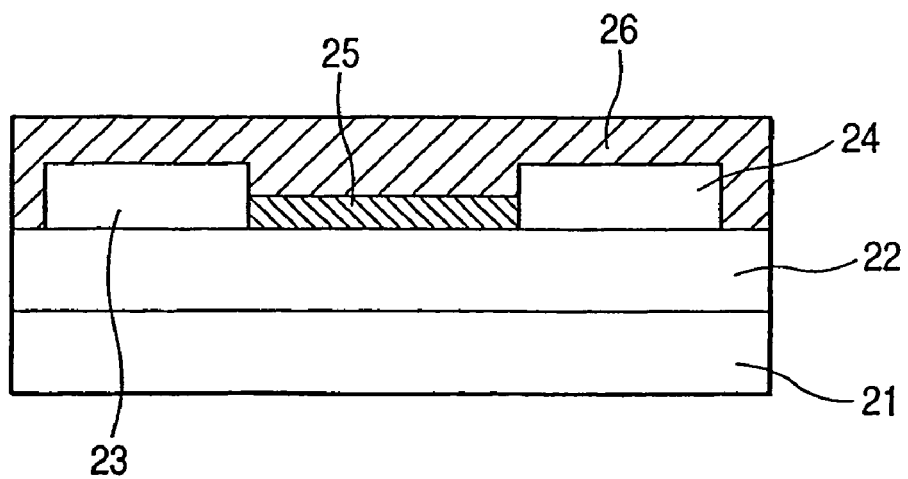
FIG. 2 is a schematic sectional view illustrating a field effect organic transistor used in an example of the present invention.

FIG. 2 illustrates the configuration diagram of the field effect organic transistor used in the example of the present invention.

In FIG. 2, there were used a highly n-type doped silicon substrate for a gate electrode 21, $SiO_2$ for a gate insulating layer 22, a chromium/gold deposition for a source electrode 23 and a drain electrode 24 and dimethylsexithiophene shown below for organic semiconductive layers 25, 26.

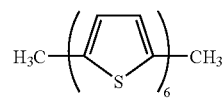

Additionally, the synthesis of dimethylsexithiophene followed the synthesis method described in Advanced Materials, 5, 896 (1993), and the compound thus synthesized was used.

Now, in what follows, the steps of fabrication will be described. On the silicon substrate, a thermally-oxidized film of $SiO_2$ (the film thickness: 300 nm) was formed. Thereover, with the aid of the lift-off method, the chromium (5 nm)/gold (100 nm) source and drain electrodes were formed with a channel length of 50 μm and a channel width of 50 mm. Thereover, the organic semiconductive layer 25 was formed by depositing dimethylsexithiophene under a pressure of $5\times10^{-6}$ torr, from Plate metal separated by 10 cm from the deposition substrate, at an average sublimation rate of 0.05 nm/s and at a substrate temperature of 25° C., until the film thickness reached 10 nm.

Thereafter, with an average sublimation rate of 1 nm/s and at a substrate temperature of 25° C., the deposition was continued until the film thickness reached 300 nm, and thus the organic semiconductive layer 26 was formed. A gold wire of 0.1 mm in diameter was wired to each of the gate electrode, drain electrode and source electrode, with the aid of silver paste, and thus a field effect organic transistor was fabricated.

In the next place, the drain current was measured for the gate voltage of 0 V to 50 V and the voltage between the source and drain electrodes of 0 V to 50 V, and thus the mobility μ was derived according to formula (I).

Additionally, the on/off ratio was derived from the ratio between the drain current for the gate voltage Vg=30 V and the drain current for Vg=0 V when a voltage of 30 V was applied as the voltage between the source and drain electrodes. The results obtained are shown below.

Mobility $\mu=2.1\times10^{-2}$ cm$^2$/Vs

On/off ratio=$10^7$

In the next place, the mobilities of the respective organic semiconductive layers 25, 26 were measured in the following Comparative Examples 1 and 2, and the results thus obtained are shown.

Comparative Example 1

A field effect organic transistor was fabricated in the same manner as that in Example 1 except that the organic semiconductive layers 25, 26 were formed under the conditions described below.

The organic semiconductive layers 25, 26 were formed by depositing dimethylsexithiophene under a pressure of $5\times10^{-6}$ torr, from Plate metal separated by 10 cm from the deposition substrate, at an average sublimation rate of 1 nm/s and at a substrate temperature of 25° C., until the film thickness reached 300 nm.

Then, evaluation was carried out in the same manner as that in Example 1, and thus the mobility and on/off ratio were derived. The results obtained are shown below.

Mobility $\mu=8.1\times10^{-6}$ cm$^2$/Vs

On/off ratio=$10^3$

Comparative Example 2

A field effect organic transistor was fabricated in the same manner as that in Example 1 except that the organic semiconductive layers 25, 26 were formed under the conditions described below.

The organic semiconductive layers 25, 26 were formed by depositing dimethylsexithiophene under a pressure of $5 \times 10^{-6}$ torr, from Plate metal separated by 10 cm from the deposition substrate, at an average sublimation rate of 0.05 nm/s and at a substrate temperature of 25° C., until the film thickness reached 300 nm.

Then, evaluation was carried out in the same manner as that in Example 1, and thus the mobility and on/off ratio were derived. The results obtained are shown below.

Mobility $\mu = 2.5 \times 10^{-2}$ cm$^2$/Vs

On/off ratio = $10^5$

Example 2

FIG. 2 illustrates the configuration diagram of the field effect organic transistor used in the example of the present invention.

There were used a highly n-type doped silicon substrate for the gate electrode 21, SiO$_2$ for the gate insulating layer 22, a chromium/gold deposition for the source electrode 23 and the drain electrode 24 and copper phthalocyanine shown below for the organic semiconductive layers 25, 26.

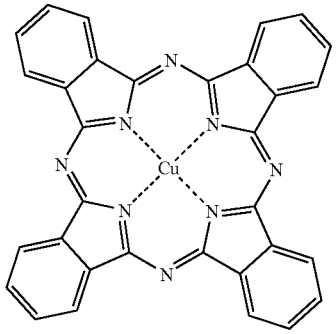

Now, in what follows, the steps of fabrication will be described. On the silicon substrate, a thermally-oxidized film of SiO$_2$ (300 nm) was formed. Thereover, with the aid of the lift-off method, the chromium (5 nm)/gold (100 nm) source and drain electrodes were formed with a channel length of 20 μm and a channel width of 50 mm. Thereover, the organic semiconductive layer 25 was formed by depositing copper phthalocyanine under a pressure of $3 \times 10^{-6}$ torr, from Plate metal separated by 10 cm from the deposition substrate, at an average sublimation rate of 0.1 nm/s and at a substrate temperature of 120° C., until the film thickness reached 20 nm.

Thereafter, with an average sublimation rate of 1 nm/s and at a substrate temperature cooled down to −50° C., the deposition was continued until the film thickness reached 500 nm, and thus the organic semiconductive layer 26 was formed. A gold wire of 0.1 mm in diameter was wired to each of the gate electrode, drain electrode and source electrode, with the aid of silver paste, and thus a field effect organic transistor was fabricated.

Then, evaluation was carried out in the same manner as that in Example 1, and thus the mobility and on/off ratio were derived. The results obtained are shown below.

Mobility $\mu = 9.1 \times 10^{-3}$ cm$^2$/Vs

On/off ratio = $10^6$

Then, the results are shown below obtained by measuring the mobility of each of the organic semiconductive layers 25, 26 in Example 2 according to the following Comparative Examples 3 and 4.

Comparative Example 3

A field effect organic transistor was fabricated in the same manner as that in Example 1 except that the organic semiconductive layers 25, 26 were formed under the conditions described below.

The organic semiconductive layers 25, 26 were formed by depositing copper phthalocyanine, from Plate metal, at an average sublimation rate of 1 nm/s and at a substrate temperature of −50° C., until the film thickness reached 500 nm.

Then, evaluation was carried out in the same manner as that in Example 1, and thus the mobility and on/off ratio were derived. The results obtained are shown below.

Mobility $\mu = 4.6 \times 10^{-8}$ cm$^2$/Vs

On/off ratio = $10^2$

Comparative Example 4

A field effect organic transistor was fabricated in the same manner as that in Example 1 except that the organic semiconductive layers 25, 26 were formed under the conditions described below.

The organic semiconductive layers 25, 26 were formed by depositing copper phthalocyanine, from Plate metal, at an average sublimation rate of 0.1 nm/s and at a substrate temperature of 120° C., until the film thickness reached 500 nm.

Then, evaluation was carried out in the same manner as that in Example 1, and thus the mobility and on/off ratio were derived. The results obtained are shown below.

Mobility $\mu = 9.3 \times 10^{-3}$ cm$^2$/Vs

On/off ratio = $10^4$

Example 3

FIG. 2 illustrates the configuration diagram of the field effect organic transistor used in the example of the present invention.

There were used a highly n-type doped silicon substrate for the gate electrode 21, polyacrylonitrile (the weight average molecular weight: 150,000) for the gate insulating layer 22, gold for the source electrode 23 and the drain electrode 24, pentacene for the organic semiconductive layer 25, and copper phthalocyanine for the organic semiconductive layer 26.

Now, in what follows, the steps of fabrication will be described. On the silicon substrate, a dimethyl sulfoxide solution of polyacrylonitrile (0.1 g/ml) was applied by the spin coating method, and dried at 70° C. for 6 hours and thus the gate insulating layer was formed. Thereover, gold (50 nm) was vacuum deposited, and thus the source and drain electrodes with a channel length of 50 μm and a channel width of 10 mm were fabricated. Thereover, the organic semiconductive layer 25 was formed by depositing pentacene under a pressure of $1 \times 10^{-6}$ torr, from Plate metal separated by 10 cm from the deposition substrate, at an average sublimation rate of 0.05 nm/s and at a substrate temperature of 25° C., until the film thickness reached 10 nm.

Thereover, the organic semiconductive layer 26 was formed by subliming copper phthalocyanine at an average sublimation rate of 1 nm/s and at a substrate temperature of −50° C., until the film thickness reached 300 nm. A gold wire of 0.1 mm in diameter was wired to each of the gate electrode, drain electrode and source electrode, with the aid of silver paste, and thus a field effect organic transistor was fabricated.

Then, evaluation was carried out in the same manner as that in Example 1, and thus the mobility and on/off ratio were derived. The results obtained are shown below.

Mobility $\mu=8.4\times10^{-1}$ cm$^2$/Vs

On/off ratio=$10^8$

Incidentally, the mobility of the organic semiconductive layer 25 made of pentacene is $1.4\times10^{-1}$ cm$^2$/Vs, and the mobility of the organic semiconductive layer 26 made of copper phthalocyanine is $4.6\times10^{-8}$ cm$^2$/Vs.

Example 4

FIG. 2 illustrates the configuration diagram of the field effect organic transistor used in the example of the present invention.

There were used a highly n-type doped silicon substrate for the gate electrode 21, SiO$_2$ for the gate insulating layer 22, a chromium/gold deposition for the source electrode 23 and the drain electrode 24 and poly(3,4-ethylenedioxythiophene) (the weight average molecular weight: 10,000) shown below for the organic semiconductive layer 25.

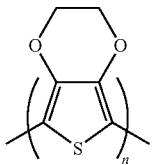

There was used regioirregular poly(3-hexylthiophene) (the weight average molecular weight: 12,000) for the organic semiconductive layer 26.

Now, in what follows, the steps of fabrication will be described. On the silicon substrate 21, a thermally-oxidized film of SiO$_2$ (300 nm) was formed. Thereover, with the aid of the lift-off method, the chromium (5 nm)/gold (100 nm) source and drain electrodes were formed with a channel length of 50 μm and a channel width of 50 mm. Thereover, a tetrahydrofuran solution of poly (3,4-ethylenedioxythiophene) (0.001 g/ml) was applied with the aid of the spin coating method, dried at 150° C. for 12 hours, and thus the organic semiconductive layer 25 of 50 nm in film thickness was formed.

Thereover, a chloroform solution of regioirregular poly (3-hexylthiophene) (0.01 g/ml) was applied with the aid of the spin coating method, dried at 120° C. for 6 hours, and thus the organic semiconductive layer 26 of 500 nm in film thickness was formed. A gold wire of 0.1 mm in diameter was wired to each of the gate electrode, drain electrode and source electrode, with the aid of silver paste, and thus a field effect organic transistor was fabricated.

Then, evaluation was carried out in the same manner as that in Example 1, and thus the mobility and on/off ratio were derived. The results obtained are shown below.

Mobility $\mu=1.1\times10^{-1}$ cm$^2$/Vs

On/off ratio=$10^6$

Example 5

A field effect organic transistor was fabricated in the same manner as that in Example 4 except that regioirregular poly (3-hexylthiophene) (the weight average molecular weight: 46,000) was used for the organic semiconductive layer 25.

Then, evaluation was carried out in the same manner as that in Example 1, and thus the mobility and on/off ratio were derived. The results obtained are shown below.

Mobility $\mu=4.2\times10^{-3}$ cm$^2$/Vs

On/off ratio=$10^5$

The invention claimed is:

1. A field effect organic transistor comprising a source electrode, a drain electrode, a gate electrode, a gate insulating layer and an organic semiconductive layer, the organic semiconductive layer comprising a first organic semiconductive layer and a second organic semiconductive layer, wherein
   the source electrode and the drain electrode are arranged on the same surface of the gate insulating layer;
   the first organic semiconductive layer and the second organic semiconductive layer are laminated in a channel region between the source electrode and the drain electrode;
   the first organic semiconductive layer is arranged at a position nearer than the second organic semiconductive layer to the gate electrode;
   the mobility in the first organic semiconductive layer is higher than the mobility in the second organic semiconductive layer;
   the first organic semiconductive layer comprises pentacene;
   the second organic semiconductive layer comprises copper phthalocyanine; and
   the first organic semiconductive layer comes into contact with only side portions of the source electrode and the drain electrode;
   a portion of the second organic semiconductive layer is arranged in the channel region; and
   the second organic semiconductive layer comes into contact with a top surface of each of the source electrode and the drain electrode.

2. The field effect organic transistor according to claim 1, in which the ratio ($\mu_1/\mu_2$) between the mobility ($\mu_1$) in the first organic semiconductive layer and the mobility ($\mu_2$) in the second organic semiconductive layer is 10 or more.

3. The field effect organic transistor according to claim 1, wherein the gate insulating layer is constructed with an organic compound.

4. The field effect organic transistor according to claim 1, wherein the first organic semiconductive layer extends from a side surface of the source electrode to a side surface of the drain electrode.

5. The field effect organic transistor according to claim 1, wherein the portion of the second organic semiconductive layer arranged in the channel region is thicker than the first organic semiconductive layer.

* * * * *